United States Patent [19]

DeBolt

[11] 4,142,008
[45] Feb. 27, 1979

[54] CARBON FILAMENT COATED WITH BORON AND METHOD OF MAKING SAME

[75] Inventor: Harold E. DeBolt, Andover, Mass.

[73] Assignee: Avco Corporation, Wilmington, Mass.

[21] Appl. No.: 810,240

[22] Filed: Jun. 27, 1977

Related U.S. Application Data

[63] Continuation-in-part of Ser. No. 230,867, Mar. 1, 1972, abandoned.

[51] Int. Cl.² ................. B32B 9/00; C23C 11/00
[52] U.S. Cl. ............................ 427/249; 427/45;
427/52; 427/112; 427/113; 427/122; 428/366;
428/367; 428/368
[58] Field of Search .............. 428/366, 367, 368;
427/249, 248 A, 248 E, 248 J, 248 R, 113, 112,
122, 52, 372 R, 399, 226, 228, 45

[56] References Cited

U.S. PATENT DOCUMENTS

| | | | |
|---|---|---|---|
| 3,317,338 | 5/1967 | Batchelor | 427/249 |
| 3,369,920 | 2/1968 | Bourdeau et al. | 427/249 |
| 3,679,475 | 7/1972 | Bashe et al. | 427/249 X |
| 3,692,565 | 9/1972 | Lersmacher et al. | 427/228 |
| 3,811,940 | 5/1974 | Douglas et al. | 428/366 X |
| 3,861,953 | 1/1975 | Basche et al. | 428/366 |

FOREIGN PATENT DOCUMENTS 793730 4/1958 United Kingdom.

Primary Examiner—Lorraine T. Kendell
Attorney, Agent, or Firm—Abraham Ogman

[57] ABSTRACT

The invention is directed to a method of making a high strength-high modulus boron filament on a carbon substrate which is coated with pyrolytic graphite. Boron is deposited over the pyrolytic graphite. A preferred method of making such a filament citing specific pyrolytic graphite deposition temperatures is described.

6 Claims, 2 Drawing Figures

CARBON FILAMENT COATED WITH BORON AND METHOD OF MAKING SAME

This is a continuation-in-part of Ser. No. 230,867, filed Mar. 1, 1972, now abandoned.

The invention relates to high strength-high modulus boron filament which is becoming increasingly used in resin matrix and metal matrix composites. The great preponderance of boron filaments marketed today contain tungsten cores. The use of a carbon filament core offers an opportunity to reduce the cost of boron filaments.

In aircraft and other space environments, performance of aircraft and space vehicles are related to the weight of the aircraft or space vehilce. Boron filament composites have a substantial advantage over metals in that their strength and modulus to weight ratio is much more favorable than is the case with metals. However, such composites are expensive and areas where these composites may replace metal are limited. It follows that if the cost of boron filament composites can be reduced, the use of these will expand. A material cost reduction generally results in a significant increase in utility. It is thought that a carbon core for boron filaments will result in a greatly decreased cost of the filament. In addition, the lower density of carbon relative to tungsten permits an increase in the specific modulus and strength.

Before proceeding, a few definitions will be provided.

A high strength-high modulus boron filament is a filament containing a core, not of boron and typically tungsten or carbon, coated with amorphous boron. Typically, such boron is made by heating the core in a reactor containing a boron halide, boron trichloride for example and a reducing agent, generally hydrogen. See. FIG. 1.

The term "cabon" is hereby defined to mean a non-graphitic carbonaceous structure, generally amorphous carbon. While pure carbon is preferred, filament consisting essentially of carbon may be used.

The term "pyrolytic graphite" is hereby defined to mean a crystalline carbonaceous structure in which there is a high degree of crystallite orientation. Crystallite orientation is not found in common graphitic materials. Additionally, pyrolytic graphite exhibits anisotropic physical properties due to its being characterized by oriented slip planes in contrast to isotropic properties of common graphite.

When elemental amorphous boron is deposited on a filament substrate or core, the boron undergoes a dimensional change during the time that it is applied to the substrate. A carbon core is not able to accommodate itself to the dimensional change and, as a result, the carbon core is strained axially beyond its ultimate limit and breaks when a "practical" thickness of boron is added.

The break in the carbon filament occurs while boron is being deposited on the filament. A single break in the core precipitates a rapid domino effect causing a very large number of breaks to propagate down the length of the filament in the boron reactor. Generally, the breaks occur along two-thirds of the length of filament in the reactor. The plurality of breaks appear like a string of very small light bulbs. The breakage over this length occurs in 100 to 300 microseconds. The breaks may be separated by an axial length as short as the diameter of the filament.

The dimensional change that occurs within the boron is directly related to the coating thickness of the boron. As the dimensional change increases, so do the stresses on the carbon filament and, so does the probability of a break occuring. The dimensional change of tthe boron is from 2% to 4% for standard boron filaments.

4 mil and 5.6 mil diameter boron filaments are industry standards. The probability of a break occuring in a one foot length of filament is of the order of 0.01% for a 3 mil filament with a 1.6 mil core. The breakage probability increases to over 90% for a 4 mil filament with a 1.3 mil core. It essentially has not been possible to make usable boron filament in the standard sizes on a carbon core not coated with pyrolytic graphite.

An interesting observation is that the boron sheath generally remains intact as the aforementioned breaks occur solely internally in the core. However, the breaks in the core impart a brittle quality to the boron. The boron breaks easily. It cannot be wound on a take-up roll. In addition, the broken core drastically reduces the strength of the boron filament.

The reasons for these breaks and the mechanism causing the breaks is not fully understood. In theory, the series of breaks appeared to be caused by a large shock wave initiated by the first break travelling down the carbon filament and into and out of the boron deposit, causing other breaks along the filament. In the vicinity of one or more of the breaks, a notch was observed in the boron coating at the interface between the boron and carbon. This tended to support the shock wave theory.

While it would appear that the initial break occurs because of the dimensional change in the boron, the additional breaks are believed to be triggered by the shock wave, where the stresses before the shock arrived were just below the fractured stress. The solution to the problem covered herein is based on placing a buffer coating between the carbon core and the boron coating. The buffer coating selected needs to satisfy the principal requirement, namely, isolating the boron coating from shocks originating in the carbon core.

Where the buffer coating material has a radial shock wave propagation velocity different from both carbon and boron, and preferably less than both carbon and boron, a shock wave that encounters an interface constructed by two materials having different shock wave propagation velocities is partially reflected and partially transmitted. The larger the difference, the larger is the reflected wave. A buffer material having a shock wave propagation velocity lower than carbon will almost certainly totally isolate the boron coating from the carbon core. The shock wave propagation velocity of pyrolytic graphite is significantly less than that of carbon.

It should be mentioned that the shock wave may cause multiple breaks in the carbon core and even in the buffer coating. The strength and structural integrity of the boron, however, is unimpaired.

The preferred buffer coating material, pyrolytic graphite, also provides two other benefits; it is able to withstand the strains induced by the boron, and reduce the strains imposed on the carbon by the boron.

Attention is also directed to the fact that carbon filaments in use today do not have a uniform diameter. Since most boron reactors use electric current to heat the carbon filament, the regions where the diameter is small reach higher temperatures than regions where the filament diameter is relatively large. Further, the amount of boron deposited depends on temperatures. Non-uniform carbon core diameters produce non-uniform boron coating thicknesses. The buffer coating tends to smooth out variations in the carbon core diameter as the thickness of the buffer coating is also directly related to temperature.

The present invention teaches that a thin coating of highly oriented pyrolytic graphite deposited as a buffer between the carbon core and the boron deposit acts to eliminate the problems described heretofore. The resultant boron product is equal in quality, in the specific strenght and specific modulus to that of a tungsten-boron filament. The resultant product can be produced in long continuous length and are sufficiently flexible so that standard take-up rolls may be used. These filaments can be handled easily and dependably and reliably used. These filaments further have more uniform boron coating thicknesses.

This invention has an object to provide a new and improved high strength-high modulus boron filament.

Another object of the invention is to provide a process for manufacturing a high strength-high modulus boron filament on a carbon substrate.

Another object of the invention is to provide high strength-high modulus boron filament with a carbon core and a process for making same that avoids limitations and disadvantages of such prior processes and filaments.

Still another of the invention's objects is to provide a high strenght-high modulus boron filament containing a carbon core, which is equal to or better than the quality of the present industry standard tungsten-boron filament.

Still another object of the invention is to provide a method of smoothing out variations in the diameter of the core filament.

Yet another object of the invention is to provide a composite core filament for making boron filament which contains a core filament and a coating, the variations in the thickness of the coating being inversely related to the variations in the diameter of the core filament.

The novel features that are considered characteristic of the invention are set forth in the appended claims; the invention itself, however, both as to its organization and method of operation, together with additional objects and advantages thereof, will best be understood from the following description of a specific embodiment when read in conjunction with the accompanying drawings, in which:

The invention will be described in relation to depositing a buffer coating of pyrolytic graphite. Pyrolytic graphite satisfies the principal requirement of isolating the boron from carbon induced shocks. The radial shock wave propagation velocity of pyrolytic graphite is less than that of boron and also less than that of the carbon core. This latter point is particularly favorable.

The ultimate strain of pyrolytic graphite is over 200 percent, well in excess of the 4 percent required. It thus is capable of reducing boron induced stresses in the carbon.

Further, the thickness of the pyrolytic graphite deposit is related directly to temperature of the substrate, in this case the carbon core filament, and thus, inversely related to core filament diameter. Variations in the diameter of the carbon core filament are smoothed out.

Other buffer coating materials which can be used, but not as effectively as the pyrolytic graphite are boron nitride, silicon carbide and spongy carbon char. The latter is produced by resin pyrolysis at temperatures below the deposition temperature of pyrolytic graphite.

Figure 1:
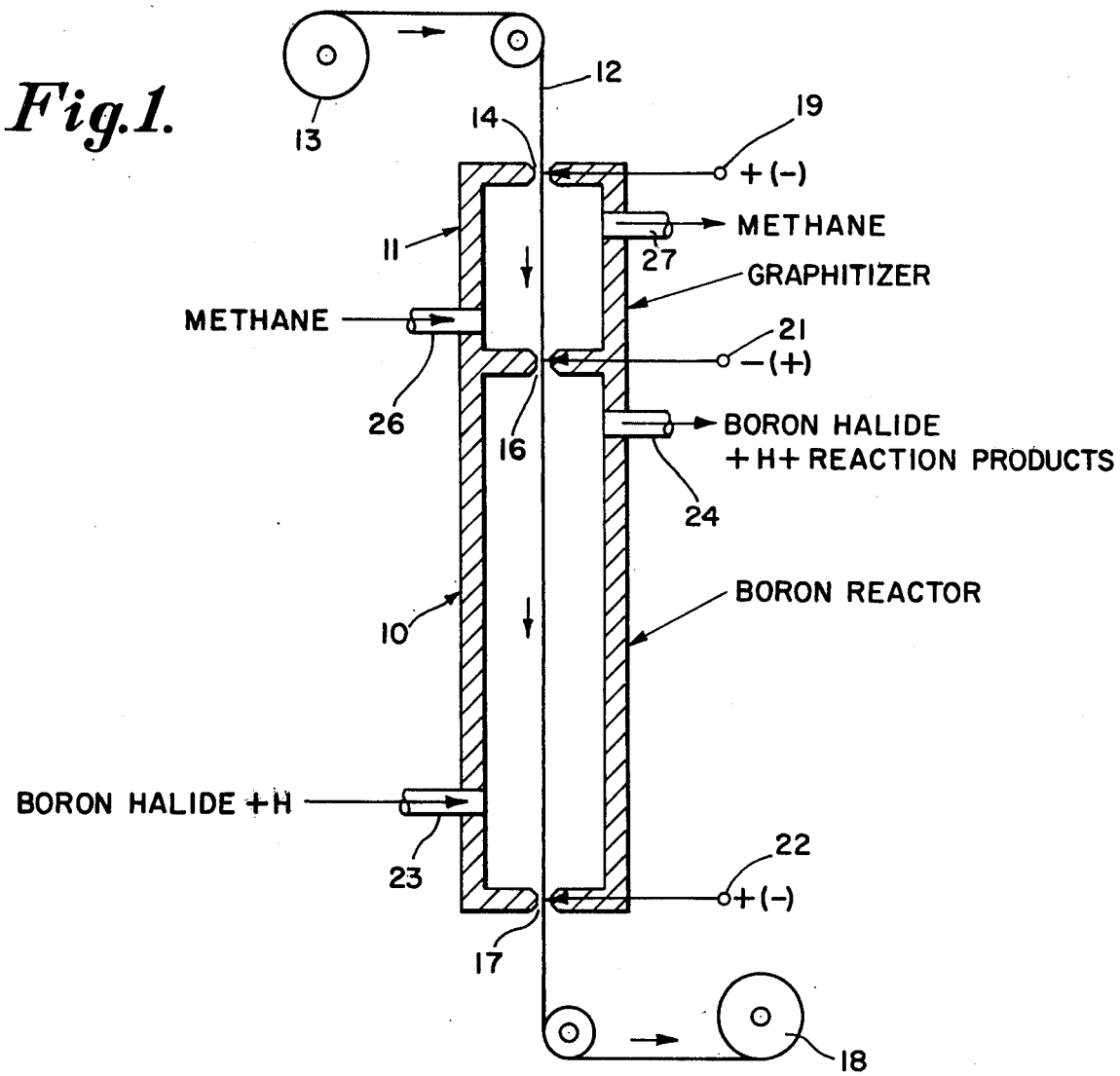
FIG. 1 is a schematic representation of a reactor for converting a carbon filament to a boron filament.

A method of carrying out the invention is shown schematically in FIG. 1. FIG. 1 depicts conventional boron reactor 10 containing at the input end thereof a filament graphitizer 11. A carbon filament 12 is taken from a supply reel 13 and passes through an opening 16 into the graphitizer 11. The filament passes through the graphitizer 11 and into an opening 16 into the boron reactor 10. The carbon filament emerges from the boron reactor through an opening 17 and is coupled to a take-up reel 18.

In the FIG. 1 illustration, the filament is heated by passing electric current through the filament 12. Alternatively, the filament 12 may be heated inductively or by any other suitable arrangement. In order to control the temperature of the filament 12 independently in the graphitizer 11 and the boron reactor 10, electric current is coupled from a terminal 19 through that portion of the carbon filament in the graphitizer and through terminal 21 to a power source. Typically, DC power is applied, although AC power may be used with certain precautions. The current supply for that portion of the carbon filament 12 in the boron reactor is controlled through terminals 21 and 22.

As is conventional, a boron halide plus hydrogen is coupled to the boron reactor 10 through an input orifice 23. The unused boron halide and hydrogen plus reaction products such as hydrogen chloride, if boron trichloride is used, leaves the boron reactor through exit orifice 24.

As the invention relates to developing a pyrolytic graphite coating on the boron filament, and further since the pyrolitic graphite coating on the carbon filament does not alter the basic process for depositing boron on the coated filament, there is no need for discussing the process parameters for depositing boron on a filament.

Referring to the graphitizer 11, the carbon filament 12 enters through opening 14 and traverses through the length of the graphitizer 10. That portion of the carbon filament within the graphitizer 11 is heated electrically through terminals 19 and 21 as previously mentioned. The material which will be thermally decomposed to deposit pyrolytic graphite on the surface of the carbon filament 12, is fed to the graphitizer 11 through input orifice 26. The unused portion of the decomposable material plus any other volatiles that result from the decomposition leave the graphitizer 11 through the orifice 27.

In practice, methane has proved to be the most desirable decomposable material. In the alternative, other hydrocarbons such as ethane, propane, acetylene, ethanol, for example, may be used. A non-hydrocarbon material that is suitable is carbon tetrachloride, for example. Resins from which spongy carbon char may be produced by pyrolysis are the phenolics, polyesters, and epoxies, for example.

In constructing the pyrolytic graphite coating on the carbon filament 12, the temperature of the filament 12 within the graphitizer 11 is maintained at a minimum of 1800° C. but preferably at about 2300° C. or higher.

Significant amounts of pyrolytic graphite will not form when carbon is deposited on a substrate when the substrate temperature is less than 1800° C.; a significant amount of amorphous or carbon black is produced. The preferred low limit of about 2300° C. is selected because as will be shown hereinafter, the strength of the resulting boron filament is a sensitive function of the temperature at which the pyrolytic graphite is deposited.

The degree of orientation, and accordingly, the strength of the pyrolytic graphite coating is also temperature sensitive. The degree of orientation rises rapidly with temperatures up to about 2500° C. and then levels off asymptotically.

The stated upper temperature limit of 2900° C. is approximate and will vary with the pressure within the graphitizer 11. At atmospheric pressures, carbon begins to evaporate at about 2900° C. Since significant evaporation causes a net loss of carbon from the filament 12, it is a condition to be avoided.

Referring briefly to the process depicted schematically in FIG. 1, carbon filament 12 is taken from a supply reel 13 and passed through a graphitizer 11 where it is heated to the preferred temperature of approximately 2500° C. The graphitizer 11 is filled with methane mixed with a suitable inert diluent such as argon or nitrogen. When methane contacts the heated filament, it decomposes, releasing elemental carbon and hydrogen. A portion of the released carbon deposits on the heated carbon filament 12 and forms a pyrolytic graphite coating. The coating thickness will vary with the time that the filament 12 remains within the graphitizer. A 7 inch long graphitizer and filament speed of 20 feet per minute produces a 0.15 mil coating. A preferred minimum pyrolytic graphite coating thickness is 0.03 mils has a degree of orientation of at least about 5 to 1.

The coated filament 12 passes into the boron reactor where sufficient boron is deposited to form a final diameter of 4 mil or 5.6 mil (overall diameter) filament, or, in fact, any other desired filament diameter. The completed filament leaves the boron reactor through the opening 17 and is taken up on the take-up reel 18.

Tests conducted on filaments made in the manner just described show that this filament equals or exceeds the specific strength and modulus of the current most widely used tungsten/boron filament. Additionally, the probability of breaks occuring in the carbon filament are minimal. Even if a break occurs and is noted, there is no domino effect as previously described and the filament maintains its strength and flexibility so that it may be used in forming a high strength-high modulus composite.

The concept of a buffer coating to overcome damage to the boron by breaks in the core filament may be applicable to cores of fused silicon which has been doped to make it electrically conductive, and to silicon carbide and zirconia cores. The invention should have general applicability to core materials which have a low ultimate strain.

Boron filament is of interest because its strength to weight ratio compared to common structural materials such as aluminum and steel is very high. It follows that the utility of boron filament composites when used as structural materials increases with the tensile strength of the boron filament. Typically, the minimum tensile strength of 4 mil diameter boron filament specified for use in aircraft composite structures is 400,000 psi. A lower tensile strength is acceptable in less demanding applications such as tennis rackets, golf club shafts, and bicycle frames. However, the performance of these items can be improved with increased strength.

The tensile strength of boron deposited on a carbon filament utilizing a pyrolytic graphite intermediate buffer coating was found to be dominated by the temperature at which the pyrolytic graphite coating was deposited. Numerous tests of tensile strength as a function of current flowing in the carbon substrate were made. Characteristically, the filament strength dropped off very rapidly as the current, and consequently the temperature, of the carbon filament was decreased.

Figure 2:
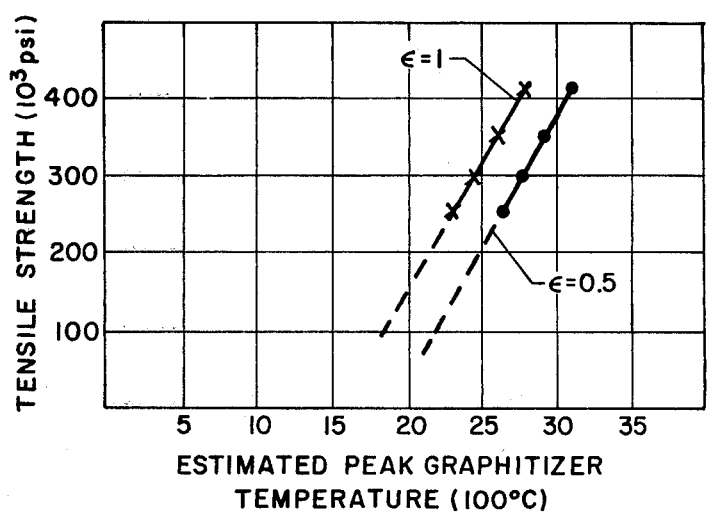
FIG. 2 is a curve useful in explaining the invention.

FIG. 2 is a curve of strength as a function of temperature. The temperatures were calculated from pyrometer readings taken on the surface of a carbon filament and electrical power measurements. An estimate is provided because the data had to be extrapolated. A number of assumptions were made and the precise emissivity "$\epsilon$" of the filament was not determined of the sensitivity of the assumptions as a function of temperature do not appear to be too great. An accuracy of $\pm$ 100° C. to $\pm$ 200° C. is considered reliable. The dotted portions of the curves are extrapolations made because data points were not available as it was known from an abundance of prior tests that inadequate tensile strengths result from graphitization at these low temperatures.

The important observation, however, to be made from FIG. 2 is that the strength of boron filament drops almost precipitously as the temperature at which the pyrolytic graphite layer is deposited is decreased. The boron filament is essentially useless if the pyrolytic graphite layer is deposited at 2100° C. and below. It is essentially inadequate for pyrolytic graphite temperature of 2100° C. to 2300° C. and below. It is also clear from the curve that the preferred graphitizing temperature is about 2300° C. as a minimum.

The precise reason or reasons why the strength of the boron filament is dependent on the graphitization temperature is not known. A clue can be had, however, by reference to the text entitled *Chemistry and Physics of Carbon - Volume 5* by Philip L. Walker, Jr.; Marcel Bekker, Incorporated, New York, New York 1969. The first chapter is devoted to pyrolytic graphite, and it is hereby incorporated by reference. On page 6 at the start of the second paragraph, the text states that the temperature of pyrolysis is one of the most influential parameters determining the structure of pyrolytic graphite. Pages 30 and 75 contain curves showing properties varying widely over a deposition temperature range of 1900° C. to 2400° C.

Whatever the reasons, high strength boron filament in at least the 4 mil to 8 mil diameter range must be deposited on a pyrolytic graphite coating which was formed at a graphitization temperature of about 2500° C. or higher.

The various features and advantages of the invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims:

I claim:

1. A method of forming high strength-high modulus boron filaments on a carbon substrate comprising:

heating the carbon filament at a temperature in excess of about 2300° C. and depositing a layer of pyrolytic graphite on the substrate surface; and depositing a boron coating on said pyrolytic graphite coating.

2. A method as described in claim 1 wherein said pyrolytic graphite coating is formed by bringing a thermally decomposable material which releases and deposits carbon into contact with a carbon filament that has been heated to a graphitizing temperature above the thermal decomposition threshhold of said material.

3. A method as defined in claim 2 wherein the carbon filament temperature is about 2500° C.

4. A method as defined in claim 2 wherein the decomposable material is a hydrocarbon.

5. A method as defined in claim 2 wherein the decomposable material is methane.

6. A method as defined in claim 1 wherein the pyrolytic graphite coating has a minimum thickness of 0.02 mils.